(12) United States Patent
Ando et al.

(10) Patent No.: US 10,366,323 B2
(45) Date of Patent: Jul. 30, 2019

(54) CROSSBAR RESISTIVE MEMORY ARRAY WITH HIGHLY CONDUCTIVE COPPER/COPPER ALLOY ELECTRODES AND SILVER/SILVER ALLOYS ELECTRODES

(71) Applicant: International Business Machines Corporation, Armonk, NY (US)

(72) Inventors: Takashi Ando, Tuckahoe, NY (US); Marwan H. Khater, Astoria, NY (US); Seyoung Kim, Mount Kisco, NY (US); Hiroyuki Miyazoe, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/880,928

(22) Filed: Jan. 26, 2018

(65) Prior Publication Data

US 2018/0287061 A1 Oct. 4, 2018

Related U.S. Application Data

(62) Division of application No. 15/473,922, filed on Mar. 30, 2017.

(51) Int. Cl.
*G06N 3/04* (2006.01)
*G06N 3/063* (2006.01)
*H01L 27/24* (2006.01)
*H01L 45/00* (2006.01)

(52) U.S. Cl.
CPC .......... *G06N 3/04* (2013.01); *H01L 27/2463* (2013.01); *H01L 45/08* (2013.01); *H01L 45/1233* (2013.01); *H01L 45/1253* (2013.01); *H01L 45/146* (2013.01); *H01L 45/1675* (2013.01); *G06N 3/063* (2013.01)

(58) Field of Classification Search
CPC ............. H01L 45/1691; H01L 45/1233; H01L 45/1253
See application file for complete search history.

(56) References Cited

U.S. PATENT DOCUMENTS

| | | |
|---|---|---|
| 3,923,568 A | 12/1975 | Bersin |
| 5,350,484 A | 9/1994 | Gardner et al. |
| 6,057,230 A | 5/2000 | Liu |
| 6,878,635 B1 | 4/2005 | Nakatani |
| 7,064,076 B2 | 6/2006 | Kulkarni |
| 8,633,117 B1 | 1/2014 | Cabral et al. |
| 8,871,107 B2 | 10/2014 | Fuller et al. |
| 8,872,149 B1 | 10/2014 | Hsieh et al. |

(Continued)

OTHER PUBLICATIONS

Ciprut et al., "Modeling Size Limitations of Resistive Crossbar Array With Cell Selectors", IEEE Transactions on Very Large Scale Integration (VLSI) Systems, 10.1109/TVLSI.2016.2570120 1063-8210 © 2016 IEEE, 8 pages.

(Continued)

*Primary Examiner* — Allison Bernstein
(74) *Attorney, Agent, or Firm* — Michael A. Petrocelli

(57) ABSTRACT

Embodiments of the present invention provide systems and methods for the fabrication of a crossbar array fabrication of resistive random access memory (RRAM) cells. The array structure contains large grain copper and its alloy or silver and its alloy. A metal cap and spacer are used to protect copper or silver from chemical modifications during memory cell patterning.

13 Claims, 9 Drawing Sheets

(56) References Cited

U.S. PATENT DOCUMENTS

| | | | |
|---|---|---|---|
| 9,099,176 | B1 | 8/2015 | Buskirk |
| 9,634,245 | B2 | 4/2017 | Gotti et al. |
| 2011/0240951 | A1 | 10/2011 | Yang et al. |
| 2011/0275220 | A1 | 11/2011 | Wu et al. |
| 2013/0187273 | A1 | 7/2013 | Zhang et al. |
| 2014/0097398 | A1 | 4/2014 | Cho et al. |
| 2015/0014152 | A1 | 1/2015 | Hoinkis et al. |
| 2015/0171321 | A1 | 1/2015 | Chan et al. |
| 2015/0371999 | A1 | 12/2015 | Kurusu et al. |
| 2015/0380272 | A1 | 12/2015 | Wu et al. |
| 2016/0218285 | A1 | 7/2016 | Wang et al. |

OTHER PUBLICATIONS

Gao et al., "Silver Patterning by Reactive Ion Beam Etching for Microelectronics Application", Materials Research Society Symposium Proceedings vol. 812 © 2004 Materials Research Society, pp. 186-190.

Hirkut et al., "Suitability of N2 Plasma for the RIE Etching of Thin Ag Layers", Received May 10, 2013; accepted May 21, 2013, pp. 54-57.

IBM et al., "Silver Metallurgy for Semiconductor Device", An IP.com Prior Art Database Technical Disclosure, Original Publication Date: Oct. 1, 1970, Original Disclosure Information: TDB 10-70 p. 1118-1119, IP.com No. IPCOM000072871D, IP.com Electronic Publication: Feb. 22, 2005, 3 pages.

Joseph et al. "Advanced Plasma Etch for the 10nm node and Beyond", Invited Paper, Advanced Etch Technology for Nanopatterning II, edited by Ying Zhang, Gottlieb S. Oehrlein, Qinghuang Lin, Proc. of SPIE vol. 8685 © 2013 SPIE • CCC code: 0277-786X/13 doi: 10.1117/12.2015189, 8 pages, Downloaded on Feb. 16, 2015, Downloaded From: <http://proceedings.spiedigitallibrary.org/>.

Luo et al., "Cu BEOL Compatible Selector with High Selectivity (>107), Extremely Low Offcurrent (~pA) and High Endurance (>1010)", 4 pages.

Markert et al., "High throughput, high quality dry etching of copper /barrier film stacks", 0167-9317/00/ © 2000 Elsevier Science B.V. All rights reserved, PI I : S0167-9317( 99 )00310-X, Microelectronic Engineering 50 (2000) 417-423.

Miyazaki et al., "Copper dry etching with precise wafer-temperature control using Cl2 gas as a single reactant", Journal of Vacuum Science & Technology B 15, 237 (19); doi: 10.1116/1.589271, (Received Jul. 11, 1996; accepted Jan. 10, 1997), © 1997 American Vacuum Society, 5 pages.

Zeng et al., "Processing and encapsulation of silver patterns by using reactive ion etch and ammonia anneal", Materials Chemistry and Physics 66 (2000) 77-82, 0254-0584/00/ © 2000 Elsevier Science S.A. All rights reserved. PII: S0 2 5 4 -0 5 84 (0 0 )0 0 2 6 4 -9, 6 pages.

Ando et al., "Crossbar Resistive Memory Array With Highly Conductive Copper/Copper Alloy Electrodes and Silver/Silver Alloys Electrodes", U.S. Appl. No. 15/473,922, filed Mar. 30, 2017, 38 pages.

Ando et al., "Crossbar Resistive Memory Array With Highly Conductive Copper/Copper Alloy Electrodes and Silver/Silver Alloys Electrodes", U.S. Appl. No. 15/709,512, filed Sep. 20, 2017, 36 pages.

Appendix P—List of IBM Patents or Patent Applications Treated as Related, Filed herewith, 2 Pages.

CROSSBAR RESISTIVE MEMORY ARRAY WITH HIGHLY CONDUCTIVE COPPER/COPPER ALLOY ELECTRODES AND SILVER/SILVER ALLOYS ELECTRODES

BACKGROUND

The present invention relates generally to the field of circuit materials, and more particularly to resistive random access memory (RRAM).

RRAM is a type of non-volatile random-access computer memory that changes the resistance across a dielectric solid-state material (e.g., a memresistor). RRAM generates defects in a thin oxide layer. These defects are oxygen vacancies (i.e., oxide bond locations where the oxygen has been removed) and can be charged and drifted under an electric field. Within RRAM cells, dielectrics (which are typically insulating materials) can be made into conducting materials through a metallic filament or conducting path formed after the application of a sufficiently high voltage. Reported RRAM systems have utilized different dielectric materials (e.g., perovskites, transition metal oxides, chalcogenides, organic charge-transfer complexes, organic donor-acceptor systems, and two dimensional insulating nitrides). A created filament may be reset or set by another voltage which results in higher resistance states (HRS) or lower resistance states (LRS), respectively.

SUMMARY

According to one embodiment of the present invention, a method is provided. The method comprises: depositing a first electrode, a first metal cap, a first metal film, and a first hardmask (HM) on a silicon surface, wherein the deposited first metal film contains one or more large crystal grains; depositing a RRAM cell over the deposited first electrode; depositing a second electrode, a second metal cap, a second metal film, and a second hardmask (HM) on the deposited RRAM cell, wherein the deposited second metal film contains one or more large crystal grains; and depositing a spacer over the second HM.

Another embodiment of the present invention provides an apparatus, based on the method described above.

DETAILED DESCRIPTION

Neuromorphic computing is directed towards the use of very-large-scale integration (VLSI) systems containing electronic analog circuits to mimic neuro-biological architectures present in the nervous system. RRAM is considered as a promising technology for electronic synapse devices or memristors for neuromorphic computing as well as high-density and high-speed non-volatile memory applications. The methods and systems of the present invention enable the coexistence of highly conductive electrodes and a small active area (i.e., $4F^2$, where F is the minimum feature size accessible by lithography within a RRAM cell). More specifically, a novel crossbar array structure with a highly conductive electrode and large grains (i.e., crystallites or microscopic crystals within a material) provide lower line resistivity at a smaller line width. Furthermore, embodiments of the present invention enable the contact area of crossbar array structure to be relatively small (e.g., $4F^2$) relative to the crossbar array, which in turn enables the miniaturization of the active device area, scalability, ease of fabrication, and cycling endurance.

Figure 1A:
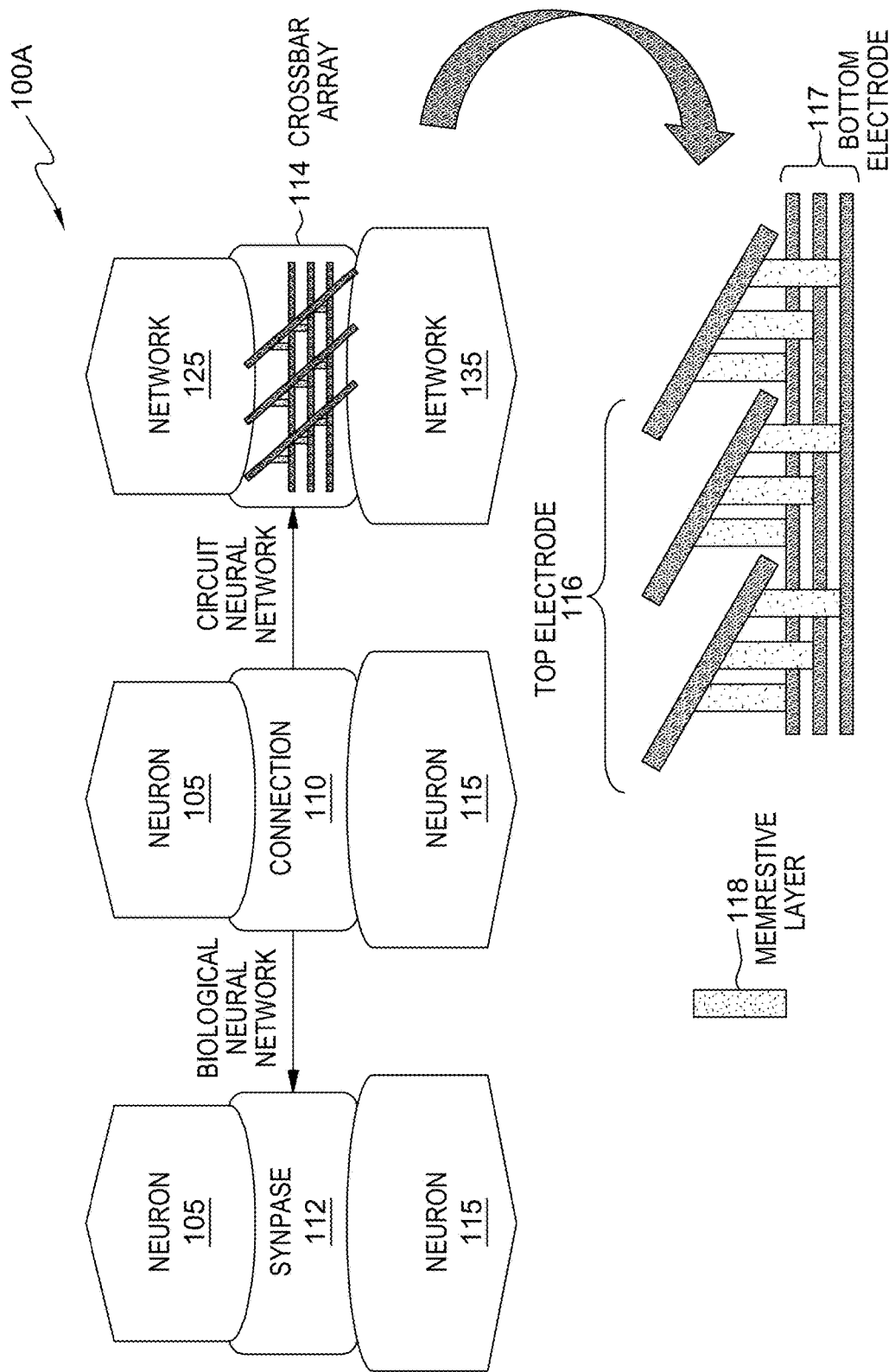
FIG. 1A is a diagram illustrating a data processing environment, in accordance with an embodiment of the present invention.

The present invention will now be described in detail by referencing the Figures. FIG. 1A is a diagram illustrating a data processing environment, generally designated 100A, in accordance with one embodiment of the present invention. FIG. 1A provides only an illustration of implementation and does not imply any limitations regarding the environments in which different embodiments may be implemented. Modifications to data processing environment 100A may be made by those skilled in the art without departing from the scope of the invention as recited by the claims. In this exemplary embodiment, data processing environment 100A includes neurons (e.g., neuron 105 and neuron 115); neural networks (network 125 and network 135); and a structure connecting neurons (e.g., connection 110).

Neuromorphic computing derives its inspiration from brain structures in order to develop a system which connects different types of neurons to each other. The structure connecting the different types of neurons is depicted as connection 110 in FIG. 1A. Neuron 105 and neuron 115 are typical cells which possess the following structures: a soma (i.e., the bulbous cell body which contains the cell nucleus), dendrites (i.e., long, feathery filaments attached to the cell body in a complex branching "dendritic tree"), and a single axon (i.e., a special, extra-long, branched cellular filament, which may be thousands of times the length of the soma). These structures (e.g., the soma, dendrites, and axons) are not depicted in FIG. 1 for clarity. Neuron 105 is a pre-neuron which sends an electric pulse traveling rapidly along the axon of neuron 105. The electric pulse is transferred across a specialized connection known as a synapse (e.g., synapse 112) to a neighboring neuron. The feathery dendrites are the receiving structures for the electric pulse for the neighboring neuron. Neuron 115 is a neighboring neuron, also referred to as a post-neuron. In biological systems, for example the human brain, connection 110 is synapse 112. Synapse 112 is a complex membrane junction or gap (the actual gap, also known as the synaptic cleft) used to transmit signals between cells. This transfer is therefore referred to as a synaptic connection. Each individual neuron can form thousands of links with other neurons leading to over 100 trillion synapses. Functionally related neurons connect to each other to form neural networks (also known as neural nets or assemblies). For the purposes of discussion of this disclosure, network 125 is a neural network comprising multiple units of neuron 105 and network 135 is a neural network comprising multiple units of neuron 115. In other words, network 125 contains pre-neurons and network 135 contains post-neurons. The connections between neurons change over time.

In neuromorphic computing applications, a resistive memory device may be used as a connection (synapse) between a pre-neuron and post-neuron, representing the connection weight in the form of device resistance. In an exemplary embodiment, connection 110 aims to connect multiple pre-neurons and post-neurons through a crossbar array of RRAMs. Crossbar array 114 connects network 125 to network 135, and thus, the combination of crossbar array 114, network 125, and network 135 represent a fully-connected neural network.

Crossbar array 114 is an array core comprising multiple units of RRAM cells. In an exemplary embodiment, crossbar array 114 is depicted as a 3-dimensional array. The darkened lines of crossbar array 114 represent electrodes, wherein the darkened diagonal lines represent the top electrode layer (e.g., top electrode 116) and the darkened horizontal lines represent the bottom electrode layer (e.g., bottom electrode 117). The vertical bars, which connect the top electrodes to the bottom electrodes, represent a memristive layer of the RRAM cell (e.g., memristive layer 118). The materials used to compose the top and bottom electrodes must be metals characterized as low sheet resistance of contact metal ($R_s$). Lower $R_s$ materials reduce the voltage drops and enables a larger array variants of crossbar array 114. Furthermore, the resistance of the RRAM-based device ($R_{device}$) must be high in order to operate the large array (e.g., crossbar array 114). In order to satisfy the requirements for lower $R_s$ and high $R_{device}$, the resistivity ($\rho$) of the materials/metals incorporated into the electrodes must be low, wherein $\rho$ is a property that quantifies how strongly a given material opposes the flow of electric current. The SI unit of resistivity is ohm-meter ($\Omega \cdot m$). Higher $\rho$ values are indicative of materials which resist/impede electrical current while lower $\rho$ values are indicative of material which conduct/promote electrical current. Resistivity is discussed in further detail with respect to FIG. 2A and FIG. 2B.

In an exemplary embodiment, memristive layer 118 is composed of an electroformed binary metal oxide and a metallic filament (which are not explicitly depicted in FIG. 1A). Furthermore, memristive layer 118 contains a high resistive region (i.e., reset state) and low resistive region (i.e., set state), which are associated with a HRS and a LRS, respectively. The boundary between the high resistive region and the low resistive region can be moved up and down as current passes through crossbar array 114 via the metallic filament. Memristive layer 118 may also be referred to as a switching material. Crossbar array 114 is based on the non-conductive metal oxide as the host material for a metallic filament formation. The switching mechanism, which moves the boundary between the high resistive region and the low resistive region, is based on an electric field. In an exemplary embodiment, the behavior of RRAM cells, within crossbar array 114, are stable across a wide temperature range. The typical RRAM cell within crossbar array 114 has a switching material (e.g., memristive layer 118) with different resistance characteristics while sandwiched directly between two metallic electrodes. The switching effect of RRAM is based on the motion of ions under the influence of an electric field or heat. The switching material's ability to store ion distribution causes a measurable change of the device resistance. There is a need for large scale integration of large RRAM arrays, such as crossbar array 114, with complementary metal oxide semiconducting (CMOS) circuits that enables scaling of RRAM devices down to 10 nanometers (nm) for neuromorphic computing as well as high-density and high-speed non-volatile memory applications. CMOS circuits are also utilized in many devices and thus, it would benefit semiconducting manufacturers to generate and provide scalable RRAMs which are compatible with CMOS technology.

Figure 1B:
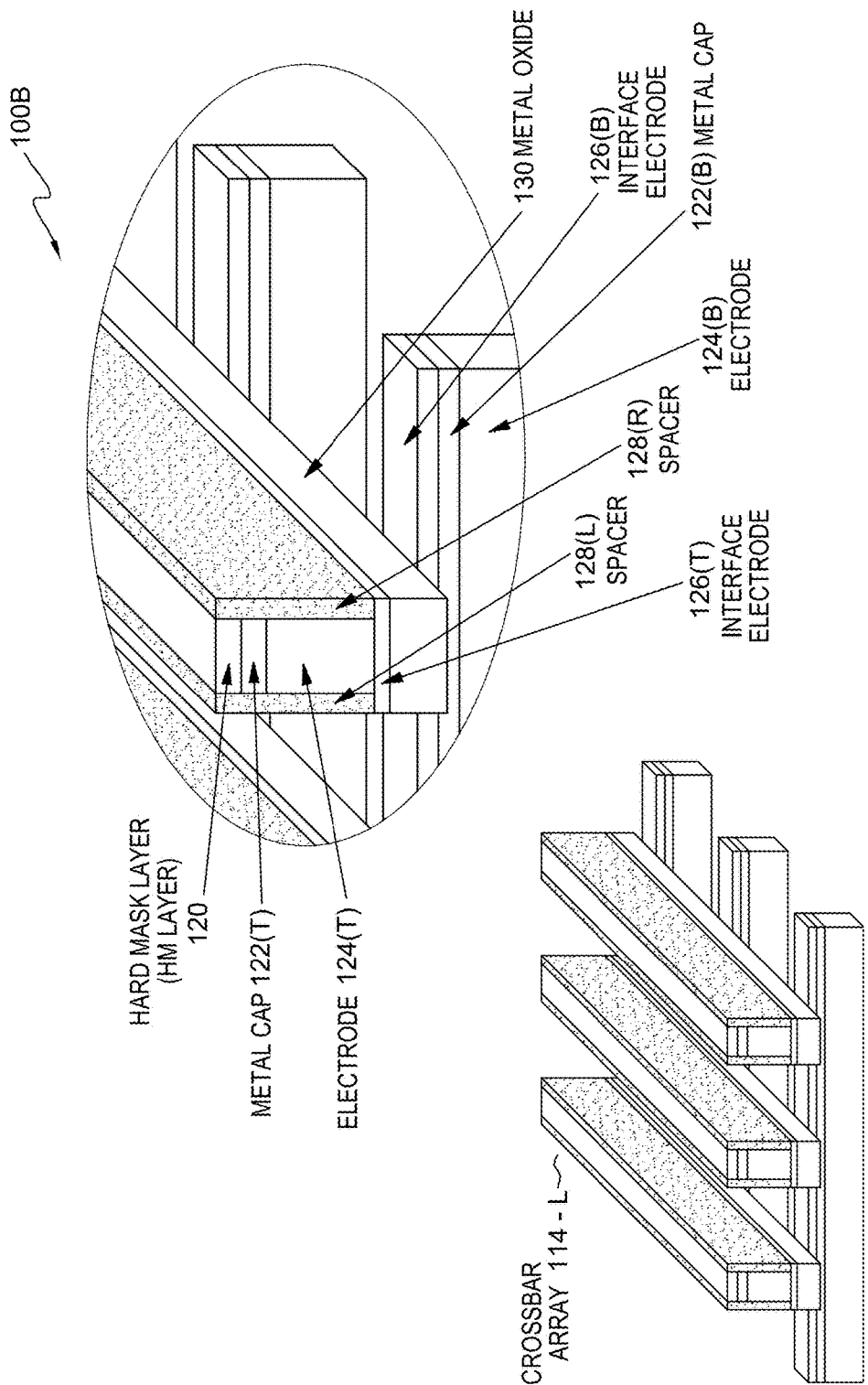
FIG. 1B is a diagram representing a more detailed view of a crossbar array structure, in accordance with an embodiment of the present invention.

FIG. 1B is a diagram representing a more detailed view of crossbar array 114, in accordance with an embodiment of the present invention.

Crossbar array 100B is a three-dimensional depiction of a section of crossbar array 114, wherein crossbar array 114-L is a layered depiction of the structural components of crossbar array 114 from FIG. 1A. The top electrode layer (which is similar or equivalent to top electrode 116 from FIG. 1A) comprises: hardmask (HM) layer 120, metal cap 122(T), interface electrode 124(T), spacer 128(L), spacer 128(R), and interface electrode 126(T). The bottom electrode layer (which is similar to bottom electrode 117 from FIG. 1A) comprises: interface electrode 126(B), metal cap 122(B), and electrode 124(B). Metal oxide 130 represents the dielectric material used for a memristive layer of a RRAM cell (which is similar or equivalent to memristive layer 118 of FIG. 1A). Metal oxide 130 may be composed of tantalum oxide, hafnium oxide, aluminum oxide, titanium oxide, and laminates thereof.

Metal oxide 130 is in contact with the top electrode layer and bottom electrode layer at interface electrode 126(T) and interface electrode 126(B), respectively. Interface electrode 126(T) and interface electrode 126(B) are both composed of titanium nitride, tantalum nitride, aluminum-containing alloy, or tungsten. Interface electrode 126(T) and interface electrode 126(B) are the same type of electrode, wherein interface electrode 126(T) and interface electrode 126(B) facilitate switching behavior of RRAM. Furthermore, interface electrode 126(T) and interface electrode 126(B) are a different type of electrode from electrode 124(T) and electrode 124(B). Depending on a desired application, one composition of interface electrode 126(T) or interface electrode 126(B) is preferred over another composition. For example, tungsten has weaker adhesive properties than titanium nitride. If the desired property is to have loosely connected components, then tungsten may be preferred over titanium nitride as the interface electrodes (e.g., interface electrode 126(T) and interface electrode 126(B)).

Electrode 124(T) and electrode 124(B) are both composed of either copper (Cu), copper-containing alloys, silver (Ag), or silver-containing alloys with large grain boundaries. Electrode 124(T) and electrode 124(B) are the same type of electrode, wherein electrode 124(T) and electrode 124(B) derive from metal films that lead to lower $R_s$ and high $R_{device}$, as described above. Furthermore, electrode 124(T) and electrode 124(B) are a different type of electrode from interface electrode 126(T) and interface electrode 126(B).

Metal cap 122(T) and metal cap 122(B) are both typically composed of tungsten, iridium, ruthenium, copper, platinum, silver, or carbon. Metal cap 122(T) and metal cap 122(B) are the same type of metal-based structure, wherein metal cap 122(T) and metal cap 122(B) is used to protect copper and silver from etching (e.g., reactive ion etching) of HM layer 120. The composition of metal cap 122(T) and metal cap 122(B) are discussed in more detail below.

The top electrode layer (e.g., top electrode 116) contains HM layer 120, spacer 128(L), and spacer 128(R). HM layer 120, which may be composed of tantalum or tantalum nitride layers, is directly above metal cap 122(T), wherein metal cap 122(T) is directly above electrode 124(T). Spacer 128(L) and spacer 128(R) are sidewall type structures which protect the copper or silver content contained within electrode 124(T) from chemical modification during etching and patterning of RRAM cells. Interface electrode 126(T) is directly above metal oxide 130 and directly below electrode 124(T).

The bottom electrode layer (e.g., bottom electrode 117) does not contain HM layer 120, spacer 128(L), and spacer 128(R). Metal cap 122(B) is directly above electrode 124(B). Interface electrode 126(B) is directly below metal oxide 130 and directly above metal cap 122(B).

Figure 2A:
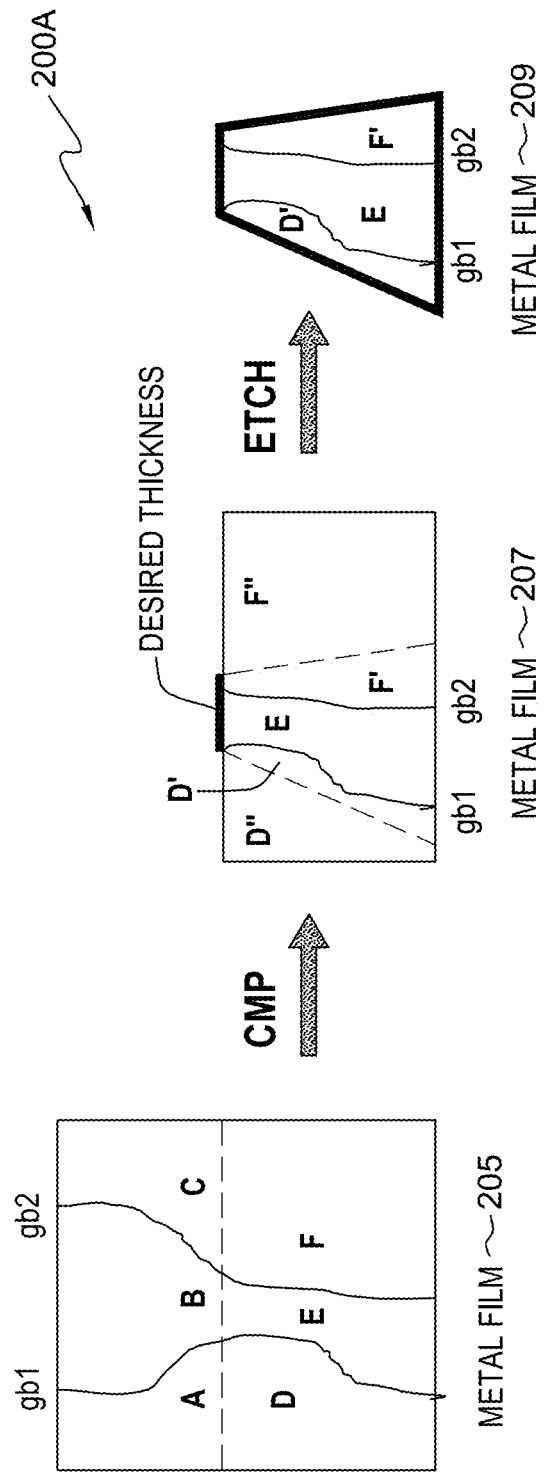
FIG. 2A is a diagram depicting grain boundaries in a metal film, in accordance with an embodiment of the present invention.

FIG. 2A is a diagram depicting grain boundaries in a metal film, in accordance with an embodiment of the present invention.

Metal 200A is a set of transformations performed on a metal surface. Copper (Cu) and silver (Ag) are transition metals used to derive the metal surface, wherein the metal surface is a portion of the metal to be incorporated into the electrodes. Large grains (i.e., crystallites or microscopic crystals within a material) within the Cu or Ag. Mayas-Shatzkes Model demonstrates the influences of the grain size on resistivity ($\rho$):

$$\rho = (\rho_o + \rho_i)[1 + [(3/8)(1-p)(\lambda)(1/t + 1/w)(S)] + [(3/2)(R/(1-R))(\lambda/G)]] \quad \text{(eq. 1)}$$

where $\rho_o$ is bulk resistivity; $\rho_i$ is the resistivity of the impurities; p is the surface scattering coefficient; $\lambda$ is the electron mean free path; t is the line thickness; w is the line width; S is the roughness pattern of the surface; R is the grain boundary scattering coefficient; and G is the average grain size. G is measured in terms of diameter in nm. Eq. 1 quantifies the inverse relationship of G on $\rho$ (i.e., as G increases, then $\rho$ decreases). As stated above, the critical dimension (CD) for RRAM devices is 10 nm, which thus corresponds to G=1000 nm. In this embodiment, these RRAM devices require electrodes of lower $\rho$ values. Furthermore, materials with lower $\rho$ values may be obtained by reducing electron scattering; controlling the line edge roughness (LER) of the material; and controlling the roughness of the surface.

In an embodiment, damascene processing techniques are used to form copper-based integrated circuit interconnects deriving from metal films. In previous reports of damascene processing, smaller grains at the trench of a metal film lead to increased electron scattering at the grain boundary of the metal film. This increased electron scattering leads to higher resistivity ($\rho$) values. In contrast, larger grains exhibit less electron scattering at the grain boundary which leads to lower resistivity ($\rho$) values. In this embodiment, Cu films are used because they are able to processed in order furnish Cu containing systems with larger grains, as described in greater detail with respect to FIG. 2B. Furthermore, subtractive patterning of Cu has potential for future integrated circuit interconnects. In an exemplary embodiment, subtractive patterning is depicted in the transformations of metal film 205 to metal film 207 to metal film 209, wherein the metal is Cu. In another exemplary embodiment, silver is the metal.

Chemical mechanical planarization (CMP) is a process of smoothing surfaces with the combination of chemical and mechanical forces. This combination is a hybrid of chemical etching and free abrasive polishing. CMP uses an abrasive and corrosive chemical slurry (which is commonly a colloid) in conjunction with a polishing pad and retaining ring, typically of a greater diameter than a silicon wafer. The pad and silicon wafer are pressed together by a dynamic polishing head and held in place by a plastic retaining ring. The dynamic polishing head is rotated with different axes of rotation (i.e., not concentric). This removes material and tends to even out any irregular topography, making the wafer flat or planar. This may be necessary to set up the wafer for the formation of additional circuit elements. For example, CMP can bring the entire surface within the depth of field of a photolithography system, or selectively remove material.

Etching is used in microfabrication to chemically remove layers from a surface to create patterns. The pattern is defined by the etching mask, because the parts of the material, which should remain, are protected by the etching mask. The unmasked material can be removed either by wet etching (i.e., chemical techniques) or dry etching (i.e., physical techniques). Wet etching is strongly isotropic and highly selective at creating pattern, wherein the etch rate greatly depends on the material being etched and does not damage the etched material. Dry etching is highly anisotropic but less selective, wherein dry etching is more conducive for transferring small structures in comparison to wet etching. Patterning may also be achieved by lithography. Lithography is used to transfer a pattern from a photomask to the surface of the wafer. For example, the gate area of a MOS transistor is defined by a specific pattern. The pattern information is recorded on a layer of a photoresist which is applied on the top of the wafer. The physical properties of the photoresist change when exposed to light or another source of illumination. The photoresist is either developed by: (i) wet etching or dry etching; or (ii) converted portions of the photoresist to volatile compounds through the exposure of external entities. The pattern, as defined by the photomask, either is removed or remains after development depending on the type of photoresist.

A metal cap layer (e.g., metal cap 122(T) and metal cap 122(B) can be formed using conventional deposition processes, such as, for example, chemical vapor deposition (CVD), atomic layer deposition (ALD), physical vapor deposition (PVD), plasma enhanced chemical vapor deposition (PECVD), or the like. In one or more embodiments, the metal cap layer can be formed of a metal such as tantalum, titanium, ruthenium, iridium, cobalt, and/or tungsten, and/or a metal nitride thereof such as tantalum nitride, titanium nitride, and tungsten nitride. In one or more embodiments, the deposition of the metal cap layer can include a nitrogen gradient so as to form the corresponding nitride (e.g., HM layer 120) on an upper portion of the metal cap layer (e.g., metal cap 122(T)). For example, deposition of tantalum can be formed on a dielectric layer to form a tantalum layer followed by introduction of a nitrogen source into the reactor to form tantalum nitride on the tantalum portion (e.g., spacer 128(L) and spacer 128(R)). In one or more embodiments, the metal cap layer (e.g., metal cap 122(T)) can range from 0.05 nm to 25 nm. In one or more other embodiments, the thickness of the metal cap layer can range from 0.1 nm to 20 nm, and in still one or more other embodiments, the thickness of the liner layer can range from 1 nm to 5 nm.

The conductive copper or silver layer (e.g., as found in electrode 124(T) and electrode 124(B)) can be deposited onto the surface of a metal cap by an electrochemical deposition process (also referred to as electroplating), e-beam evaporative deposition, physical vapor deposition, CVD, or the like. For example, it should be noted that subsequent to copper deposition, the conductive copper layer can be annealed at temperatures of about 50° C. to 500° C. in order to produce large grains. Notably, the annealing of the copper films has been demonstrated to produce larger grain size (e.g., as compared to no annealing). For example, the annealing step can produce average grain sizes of approximately 1 micrometer in diameter (the distance from grain boundary to grain boundary across the grain), average grain sizes greater than or equal to the linewidth, or greater than or one half of the linewidth of a resulting electrically conductive interconnect line. It is noted that in general, the larger the grain size, the greater reduction in grain boundary scattering. In addition, the smaller the size of the electrically conductive interconnect line, the greater percentage reduction in grain boundary scattering and resistivity/resistance (as compared to forming an interconnect structure of the same dimensions using damascene processing).

In one or more embodiments of the invention, the conductive copper layer (e.g., as found in electrode 124(T) and electrode 124(B)) is subjected to a planarization process such as chemical mechanical planarization (CMP). The CMP process can be timed if the structure does not include etch stops therein. As such, average grain sizes can be approximately equal to the thickness of the conductive copper layer. In one or more embodiments, the copper layer can be at a thickness of 10 nm to 100 nm, although a greater or lesser thickness can be used.

Metals such as tantalum, titanium, iridium, tungsten, tungsten nitride, nickel, platinum, ruthenium, cobalt, or the like prevent electromigrations and protect copper or silver layer from HM patterning in the top and the bottom electrode layers. In one or more embodiments, a barrier type layer is formed of ruthenium. In one or more embodiments, the barrier type layer is formed of cobalt or Ta or W or Ru. In one or more embodiments, the barrier type layer can be at a thickness of 1 nm to 20 nm, although a greater or lesser thickness can be used.

The hardmask layer (e.g., HM layer 120) can be formed using conventional deposition processes, such as, for example, CVD, atomic layer deposition (ALD), physical vapor deposition (PVD), plasma enhanced chemical vapor deposition (PECVD), etc. The hardmask layer can include any material capable of functioning as an etch stop layer, such as, for example, titanium nitride, tantalum nitride, silicon nitride, and silicon oxynitride, or the like. In one or more embodiments, hardmask layer includes a thickness ranging from about 5 nm to about 75 nm, although a greater or lesser thicknesses can be used.

In one or more embodiments of the invention, a planarized layer is patterned using a photolithography technique, such as optical lithography or direct write electron beam lithography or the like. For example, a photosensitive resist layer can be deposited onto the planarized layer and lithographically patterned to expose selected portions of the planarized layer. The photosensitive resist layer can be formed using conventional deposition techniques such chemical vapor deposition, plasma vapor deposition, sputtering, dip coating, spin-on coating, brushing, spraying, and other like deposition techniques can be employed. Following formation of the photosensitive resist layer, the photosensitive resist layer is exposed to a desired pattern of radiation such as 193 nm, X-ray radiation, extreme ultraviolet (EUV) radiation, electron beam radiation or the like. Illustrative examples of 193 nm photosensitive resist layers include a methacrylate polymer, a phenolic based polymer or a copolymer thereof. Other types of organic photoresists such as, for example, polyesters can also be employed. Next, the exposed photosensitive resist layer is developed utilizing a conventional resist development process to expose selected portions of the planarized layer, which can then be exposed to a wet or dry etchant to form the pattern.

In an exemplary embodiment, metal film 205 is a thick blanket copper film with large crystal grains. There are three large crystal grains in metal film 205. The first large crystal grain is composed of region A and region D. The second large crystal grain is composed of region B and region E. The third large crystal grain is composed of region C and region F. There two grain boundaries in metal film 205—gb1 and gb2. The first large crystal grain is separated from the second large crystal grain by gb1. The second large crystal grain is separated from: (i) the first large crystal grain by gb1, and (ii) the third large crystal grain by gb2. The third large crystal grain is separated from the second large crystal grain by gb2.

Upon performing CMP of metal film 205, metal film 205 is transformed into metal film 207. The CMP of metal film 205 is the process by which regions A, B, and C are removed and thus rendering metal film 207 as containing regions D, E, and F, wherein region D is composed of subregions D' and D" and region F is composed of subregions F' and F". The grain boundaries—gb1 and gb2—separate region E from subregion D' and subregion F', respectively. In an exemplary embodiment, metal film 207 is etched to a desired thickness, as depicted in FIG. 2A.

Upon etching metal film 207, metal film 207 is transformed into metal film 209. The etching of metal film 205 is the process by which subregions D" and F" are removed and thus rendering metal film 207 as containing subregions D', E, and F'. The grain boundaries—gb1 and gb2—separate region E from subregion D' and subregion F', respectively.

Figure 2B:
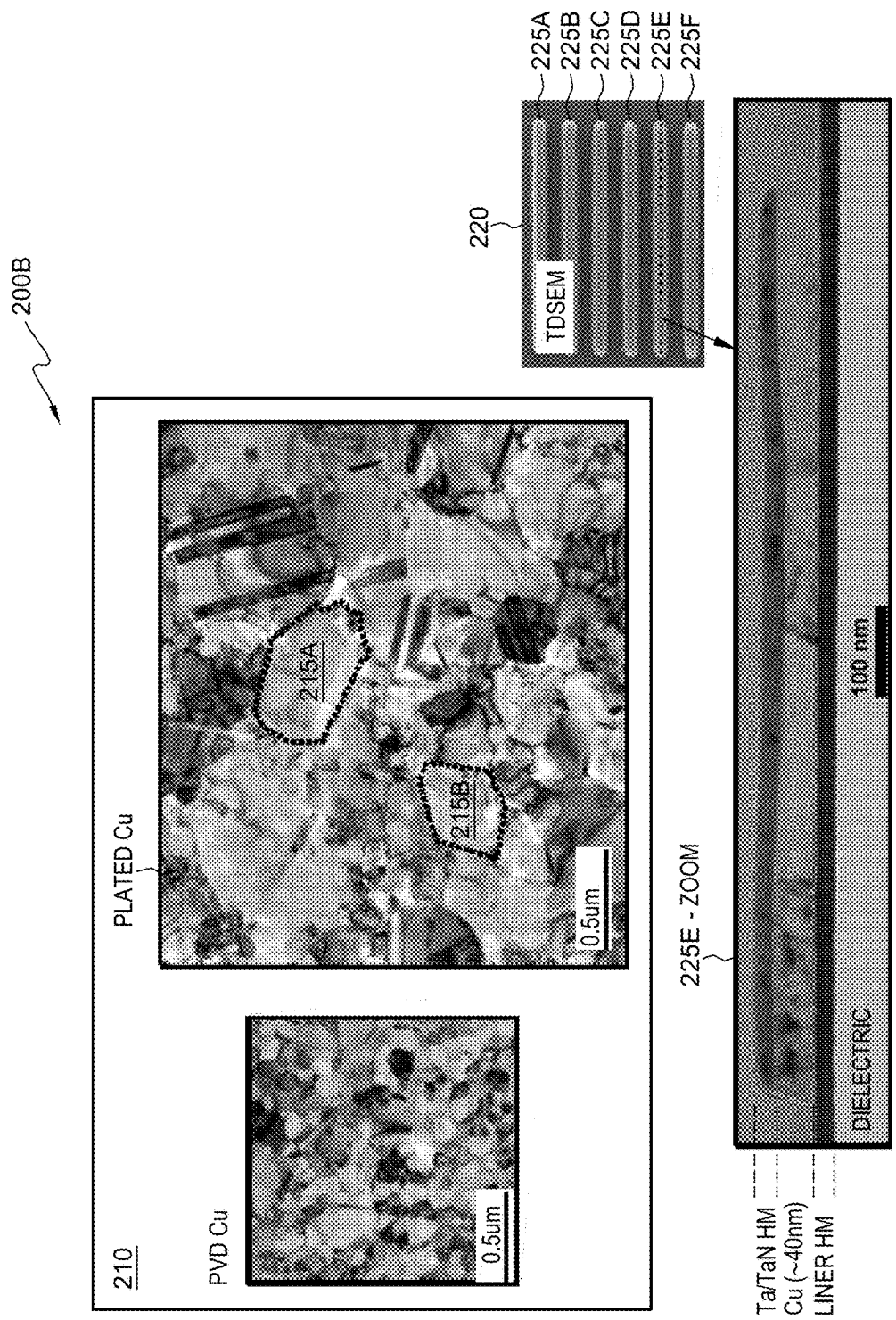
FIG. 2B contains screen shot visualizations of copper using scanning electron microscopes (SEM), in accordance with an embodiment of the present invention.

FIG. 2B contains screen shot visualizations of copper using scanning electron microscopes (SEM), in accordance with an embodiment of the present invention.

Visualization environment 200B illustrate grain patterning using SEM.

Cu-Surface 210 is a solid-state material visualized using SEM. By subtractive etching of the Cu, surface larger grains are obtained than the grains observed in line CD of Cu. The size of the Cu grain is similar to the line CD of Cu for instances that apply damascene processing techniques, as described above. In contrast, the size of Cu grain is independent from the line CD of Cu for instances of subtractive etching of Cu. Thus, blanket Cu with large grains are utilized as materials for subtractive etching. These larger grain obtained by subtractive etching are on the sub-micron scale ($10^{-6}$ m) as opposed to the nanometer scale ($10^{-9}$ m). SEM photographs of these larger grains are represented by grains 215A and 215B.

Physical vapor deposited (PVD) Cu is depicted using SEM in FIG. 2B. During the physical vapor deposition, accelerated gas ions sputter particles from a sputter target in a low pressure plasma chamber which may modify a Cu-surface. Plated Cu is another example of a modified Cu-surface. Plating is a surface covering in which a metal is deposited on a conducting surface. Plating can be achieved by: (i) reducing cationic species with electric current to yield metal coatings on an electrode (i.e., electroplating); (ii)

heating and fusing a solid surface covered with a metal sheet (i.e., Sheffield Process); and (iii) coating metal on non-metallic objects (i.e., metallizing). For the PVD Cu and the plated Cu obtained using subtractive etching, the grain sizes are larger than the line width of the PVD Cu and plated Cu. For PVD Cu, the grain size is greater than 50 nm. For plated Cu, the grain size can be greater than the sub-micron scale. These higher grain size values correspond/lead to lower resistivity values for the electrode. After patterning PVD Cu or plated Cu which has undergone subtractive etching, the effect of the increased grain size within Cu may be mitigated by decreasing the grain size. This in turn would increase the resistivity of the material. However, the increased grain sizes are sustained after patterning, as exhibited by Cu Pattern 225E. Cu Pattern 220 is a top down SEM (TDSEM) visualization of the Cu-lines (e.g., Cu-lines 225A-F) which result from patterning a Cu-surface with large grains (e.g., increasing G-values for Eq. 1). Only three crystal grains are seen in Cu-line 225E, wherein Cu-line 225E is 1 µm long. Cu-line 225E-Zoom is the cross sectional TEM image of subtractively etched Cu-lines, which is obtained using a 130 nm pitch (i.e., the shortest distance between two integrated circuit interconnect lines). The topography of Cu-line 225E contains a dielectric layer, liner hardmask (HM) layer, a Cu layer (which is ~40 nm thick), and Tantalum/Tantalum nitride hardmask (Ta/TaN) layer. Cu grain size cannot be identified from the TDSEM visualization because the Ta/TaN hardmask is covering the surface.

Figure 3:
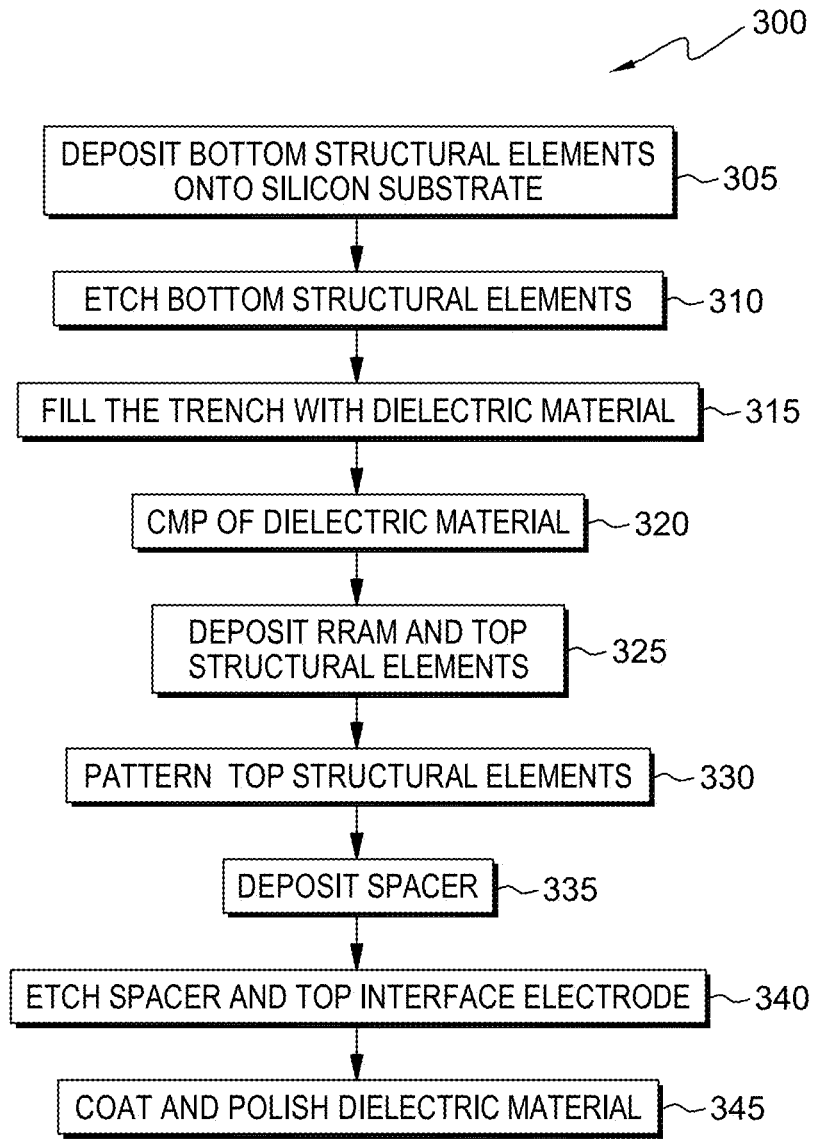
FIG. 3 is a flowchart depicting the processing steps to construct the crossbar array of RRAM cells, in accordance with an embodiment of the present invention.

FIG. 3 is a flowchart 300 depicting the processing steps involved in the construction of the crossbar array of RRAM cells, in accordance with an embodiment of the present invention.

Flowchart 300 summarizes the processing steps implemented during the fabrication of RRAM cells connected to a top electrode and bottom electrode. These electrodes are composed of large grain containing Cu or large grain containing Ag, as described above with respect to FIG. 2A and FIG. 2B. The actor of this invention which is performing the steps of flowchart 300 is a plurality of fabrication devices for performing the techniques with respect to fabrication processing. Fabrication processing involves the following techniques/processes applied on a uniformly doped silicon wafer (i.e., semiconductor fabrication)—lithography; etching; deposition; oxidation; chemical mechanical planarization; ion implantation; and diffusion—to furnish integrated circuits, wherein the integrated circuits may contain multiple units of transistors. This is not an exhaustive list of techniques/processes included within fabrication processing but rather a list of commonly used techniques as understood in the art. Furthermore, the term "fabrication processing" implies a device or set of devices or any type of equipment used to implement the said techniques/processes, as understood in the art.

In step 305, fabrication processing invokes a plurality of fabrication devices to deposit the bottom structural elements onto a silicon substrate. In an exemplary embodiment, the deposited bottom structural elements include the bottom hardmask (HM) layer (e.g., HM layer 120), bottom metal cap (e.g., metal cap 122(B), a bottom interface electrode (e.g., interface electrode 126(B)), and a copper or silver electrode (e.g., electrode 124(B)). The bottom metal cap typically comprises: tungsten, iridium, ruthenium, copper, platinum, gold, and carbon-based materials. The silicon substrate may be in the form of a wafer. The actual arrangement of these structural elements are described with respect to FIG. 4A (see structure 470/structure 470-R). The bottom HM layer (e.g., HM layer 120) may be composed of silicon nitride or thallium nitride, wherein the bottom HM layer (e.g., HM layer 120) is resistant to oxidations.

In step 310, fabrication processing invokes a plurality of fabrication devices to etch the bottom structural elements. The bottom structural elements, which include the deposited bottom hardmask (HM) layer (e.g., HM layer 120), bottom metal cap (e.g., metal cap 122(B), a bottom interface electrode (e.g., interface electrode 126(B)), and a copper or silver electrode (e.g., electrode 124(B)), are etched, while the silicon substrate is not modified chemically or physically. The actual arrangement of these structural elements are described with respect to FIG. 4A (see structure 473/structure 473-R and structure 475/structure 475-R). In an exemplary embodiment, a first etching is performed on the deposited bottom HM layer (e.g., HM layer 120) and deposited bottom electrode to remove portions of the deposited bottom HM layer (e.g., HM layer 120) and the deposited bottom interface electrode (e.g., interface electrode 126(B)). A second etching is performed on deposited metal cap to remove portions of the deposited metal cap (e.g., metal cap 122(B)). These two etchings modify the deposited bottom structural elements, wherein the bottom structural elements reside in a trench like setup. Etching is described in more detail with respect to FIG. 2A.

In step 315, fabrication processing invokes a plurality of fabrication devices to fill the trench with the bottom dielectric material. This dielectric material includes, but is not limited to, silicon oxide, silicon nitride, and spin on glasses. The deposited bottom hardmask (HM) layer (e.g., HM layer 120), bottom metal cap (e.g., metal cap 122(B)), a bottom interface electrode (e.g., interface electrode 126(B)), and a copper or silver electrode (e.g., electrode 124(B)), have been modified via etching (as described in step 310) while the silicon substrate remains unmodified chemically or physically. In an exemplary embodiment, the modified bottom HM layer (e.g., HM layer 120), modified bottom metal cap (e.g., metal cap 122(B)), modified bottom interface electrode (e.g., interface electrode 126(B)), and modified bottom copper or silver electrode (e.g., electrode 124(B)) are coated with the bottom dielectric material. The actual arrangement of these structural elements are described with respect to FIG. 4A (see structure 477/structure 477-R).

In step 320, fabrication processing invokes a plurality of fabrication devices to CMP of the dielectric material. The modified bottom hardmask (HM) layer (e.g., HM layer 120), bottom metal cap (e.g., metal cap 122(B)), a bottom interface electrode (e.g., interface electrode 126(B), and a copper or silver electrode (e.g., electrode 124(B)), which have been coated with the dielectric material, are "surrounded" by dielectric material in a non-planar fashion. In an exemplary embodiment, CMP (as described with respect to FIG. 2A) imparts planarity to the system by: (i) the removal of and leveling of portions of the coated dielectric material; and (ii) the removal of the entire modified bottom hardmask layer (e.g., HM layer 120). The actual arrangement of these structural elements are described with respect to FIG. 4A (see structure 479/structure 479-R).

In step 325, fabrication processing invokes a plurality of fabrication devices to deposit the RRAM and top structural elements. The RRAM (e.g., metal oxide 130) is directly above the dielectric material and modified bottom electrode layers, wherein the RRAM (e.g., metal oxide 130) is directly below the deposited top structural elements. The deposited top structural elements include a top hardmask (HM) layer (e.g., HM layer 120), a top metal cap (e.g., metal cap 122(T)), a top interface electrode (e.g., interface electrode 126(T)), and a top copper or silver electrode (e.g., electrode 124(T)). In an exemplary embodiment, the top HM layer (e.g., HM layer 120), the top metal cap (e.g., metal cap 122(T)), the top interface electrode (e.g., interface electrode 126(T)), and the top copper or silver electrode (e.g., electrode 124(T)) deposited on the RRAM (e.g., metal oxide 130) are composed of the same materials as the bottom HM layer (e.g., HM layer 120), the bottom metal cap (e.g., metal cap 122(B)), the bottom interface electrode (e.g., interface electrode 126(B)), and the bottom copper or silver electrode (e.g., electrode 124(B)) deposited on the silicon substrate, respectively. In another exemplary embodiment, the top interface electrode (e.g., interface electrode 126(T)) and top copper or silver electrode (e.g., electrode 124(T) are composed of different materials than the bottom interface electrode (e.g., interface electrode 126(B)) and bottom copper or silver electrode (e.g., electrode 124(B)), respectively. The actual arrangement of these structural elements are described with respect to FIG. 4B (see structure 481/structure 481-R).

In step 330, fabrication processing invokes a plurality of fabrication devices to pattern the top structural elements. The top structural elements, which include the deposited top HM layer (e.g., HM layer 120), the top metal cap (e.g., metal cap 122(T)), and the top copper or silver electrode (e.g., electrode 124(T)) are patterned, while the RRAM (e.g., metal oxide 130) and the top interface electrode (e.g., interface electrode 126(T)) are unmodified at this point. The actual arrangement of these structural elements are described with respect to FIG. 4B (see structure 483/structure 483-R and structure 485/structure 485-R). In an exemplary embodiment, a first patterning is performed on the deposited top HM layer and deposited top interface electrode to remove portions of the deposited top HM layer (e.g., HM layer 120) and deposited top copper or silver electrode (e.g., electrode 124(T)). A second patterning is performed on deposited top metal cap (e.g., metal cap 122(T)) to remove portions of the deposited top metal cap (e.g., metal cap 122(T)). These two patterning sub-steps modify the deposited top structural elements. Patterning is described in more detail with respect to FIG. 2A.

In step 335, fabrication processing invokes a plurality of fabrication devices to deposit a spacer. In an exemplary embodiment, the spacer is a layer composed of silicon nitride. The spacer should be a dielectric material but is not limited to silicon nitride. A deposited spacer layer surrounds the deposited top HM layer (e.g., HM layer 120), deposited top metal cap (e.g., metal cap 122(T)), and deposited top copper or silver electrode (e.g., electrode 124(T)) have been modified via the patterning of step 330 while the RRAM (e.g., metal oxide 130) and the top interface electrode (e.g., interface electrode 126(T)) are unmodified at this point. In an exemplary embodiment, these modified top structural elements are surrounded by the spacer on the top edge, left edge, and right edge. The actual arrangement of these structural elements are described with respect to FIG. 4C (see structure 487/structure 487-R).

In step 340, fabrication processing invokes a plurality of fabrication devices to etch the spacer and the top interface electrode. In an exemplary embodiment, a RRAM stack is a type/example of a top interface electrode (e.g., interface electrode 126(T)). The spacer layer and the top interface electrode (e.g., interface electrode 126(T)) are modified by removing portions of the deposited spacer layer (from step 335) and the deposited top interface electrode (from step 325). The actual arrangement of these structural elements are described with respect to FIG. 4C (see structure 489/structure 489-R and structure 491/structure 491-R). In an exemplary embodiment, a first etching is performed on the deposited spacer layer to remove portions of the deposited layer residing on the top edge of the top structural elements and maintaining portions of the deposited spacer layer residing on the right edge and the left edge of the top structural elements. A second etching is performed on deposited RRAM stack (e.g., interface electrode 126(T)) to remove portions of the deposited RRAM (e.g., metal oxide 130) in order to pattern the memory cells in RRAM. The modified spacer serve as walls which protect the Cu or Ag contained within the top deposited elements from chemical modification while patterning the memory cells in RRAM. Etching is described in more detail with respect to FIG. 2A.

In step 345, fabrication processing invokes a plurality of fabrication devices to coat and polish the top dielectric material. The coating with the top dielectric material occurs such that the top dielectric materials add to the spaces in between two columns and on top of each column. Furthermore, each column comprises a portion of the modified spacer, a portion of the modified top HM layer (e.g., HM layer 120), a portion of the modified top metal cap (e.g., metal cap 122(T)), a portion of the modified top copper or silver electrode (e.g., electrode 124(T)), and a portion of the modified interface electrode (e.g., interface electrode 124(T)) from steps 330 and 340. Upon polishing the top dielectric layer and the modified top HM layer, the top dielectric layer is modified by removal of portions of the top dielectric layer and the modified top HM layer (e.g., HM layer 120) is further modified removing portions of the modified top HM layer. The polished structure resembles a functional RRAM crossbar array (e.g., crossbar array 114). The actual arrangement of these structural elements are described with respect to FIG. 4D (see structure 493/structure 493-R and structure 495/structure 495-R).

Figure 4A:
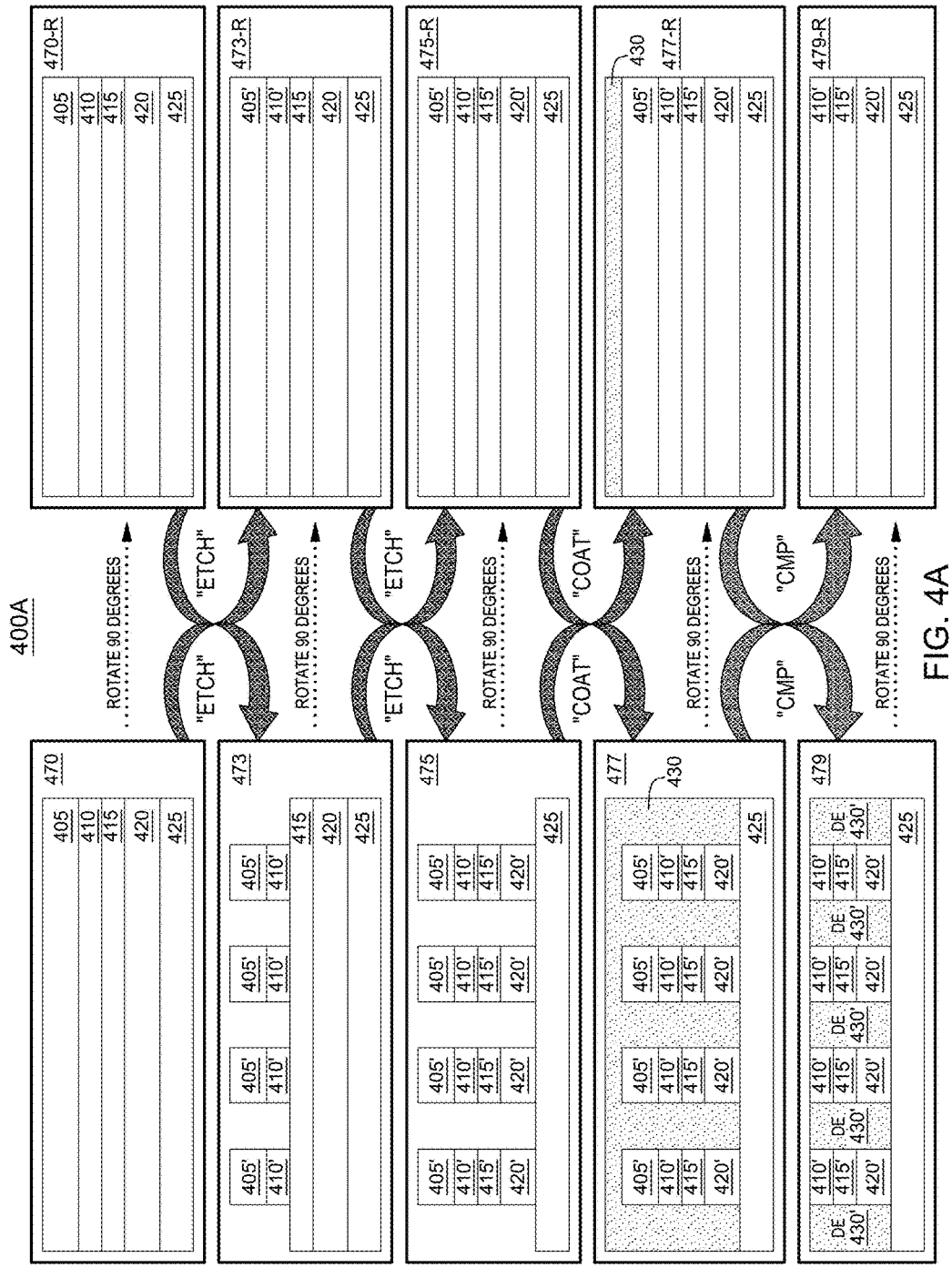
FIG. 4A is a screen shot of intermediate structures depicting the formation of the bottom electrode layer of a crossbar array of RRAM cells, in accordance with an embodiment of the present invention.

FIG. 4A is a screen shot view of intermediate structures depicting the formation of the bottom electrode layer of a crossbar array of RRAM cells, in accordance with an embodiment of the present invention.

RRAM structures 400A depict the intermediate structures observed in order to furnish the bottom electrode layer. Each structure is depicted in two ways—a direct view (i.e., a front view) and a 90 degree rotated view. In some instances, the shift in structure is apparent in the direct view (i.e., a front view) and in other instances, the shift in structure is apparent in the 90 degree rotated view. A single apostrophe (') represents a physical modification to a layer of a structural element and a double apostrophe (") represents a further physical modification to an already physically modified layer. Surface 425 is a silicon substrate which can act as a wafer and is amenable to semiconductor fabrication techniques. In this exemplary embodiment, a Cu-based electrode similar or equivalent to electrode 124(B) derives from plated Cu (e.g., plated Cu 420). In other embodiments, electrode 124(B) may derive from Ag, Ag-based alloys, Cu-based alloys, PVD Cu, or other Cu/Ag species containing large grain boundaries within the solid-state structure.

Structure 470 is a direct view (i.e., a front view) of the resulting structure where HM 405, INT electrode 410, metal cap 415, and plated Cu 420 are deposited onto surface 425. Plated Cu 420 is directly above surface 425, wherein plated Cu 420 is directly below metal cap 415, wherein metal cap 415 is directly below INT electrode 410, and wherein INT electrode 410 is directly below HM 405. HM 405, INT electrode 410, metal cap 415, and plated Cu 420 are the deposited bottom structural elements, as described in step 305 of FIG. 3. INT electrode 410 is an electrode similar or equivalent to interface electrode 126(B). Plated Cu 420 contains large grain boundaries and is used to construct an electrode similar or equivalent to electrode 124(B). HM 405 and metal cap 415 are the similar or equivalent structures are HM layer 120 and metal cap 122(B), respectively.

Structure 470-R is a 90 degree rotated view of the resulting structure where HM 405, INT electrode 410, metal cap 415, and plated Cu 420 are deposited onto surface 425. Plated Cu 420 is directly above surface 425, wherein plated Cu 420 is directly below metal cap 415, wherein metal cap 415 is directly below INT electrode 410, and wherein INT electrode 410 is directly below HM 405. HM 405, INT electrode 410, metal cap 415, and plated Cu 420 are the deposited bottom structural elements, as described in step 305 of FIG. 3.

Structure 473 is a direct view (i.e., a front view) of the resulting structure from etching structure 470. HM 405 and INT electrode 410 of structure 470 are the only components of structure 470 which have been modified. Portions of HM 405 and INT electrode 410 are removed via etching and thus yielding HM 405' and INT electrode 410'. Structure 473 illustrates the structural shift from structure 470 as there are four columns in structure 473 which are not present in structure 470. Each column in structure 473 consists of HM 405' and INT electrode 410'. Plated Cu 420 is still directly above surface 425, wherein plated Cu 420 is still directly below metal cap 415, wherein metal cap 415 is directly below INT electrode 410', and wherein INT electrode 410' is directly below HM 405'. HM 405' and INT electrode 410' are the deposited bottom structural elements which are modified by etching, as described in step 310 of FIG. 3.

Structure 473-R is a 90 degree rotated view of the resulting structure from etching structure 470. HM 405 and INT electrode 410 of structure 470-R are the only components of structure 470-R which have been modified. Portions of HM 405 and INT electrode 410 are removed via etching and thus yielding HM 405' and INT electrode 410'. Structure 473-R does not readily illustrate the structural shift from structure 470-R. The four columns in structure 473 resulting from etching structure 470 do not appear as columns in the 90 degree rotated view. Plated Cu 420 is still directly above surface 425, wherein plated Cu 420 is still directly below metal cap 415, wherein metal cap 415 is directly below INT electrode 410', and wherein INT electrode 410' is directly below HM 405'. HM 405' and INT electrode 410' are the deposited bottom structural elements which are modified by the first etching, as described in step 310 of FIG. 3.

Structure 475 is a direct view (i.e., a front view) of the resulting structure from etching structure 473. Metal cap 415 and plated Cu 420 of structure 475 are the only components of structure 473 which have been modified. Portions of metal cap 415 and plated Cu 420 are removed via etching and thus yielding metal cap 415' and plated Cu 420'. Structure 475 illustrates the structural shift from structure 473 as there are four columns in structure 475 are extended in comparison to the corresponding column in structure 473. Each column in structure 473 consists of HM 405', INT electrode 410', metal cap 415', and plated Cu 420'. Plated Cu 420' is directly above surface 425, wherein plated Cu 420' is directly below metal cap 415', wherein metal cap 415' is directly below INT electrode 410', and wherein INT electrode 410' is still directly below HM 405'. Metal cap 415' and plated Cu 420' are the deposited bottom structural elements which are modified by the second etching, as described in step 310 of FIG. 3.

Structure 475-R is a 90 degree rotated view of the resulting structure from etching structure 473. Metal cap 415 and plated Cu 420 of structure 475-R are the only components of structure 473 which have been modified. Portions of metal cap 415 and plated Cu 420 are removed via etching and thus yielding metal cap 415' and plated Cu 420'. Structure 475-R does not readily illustrate the structural shift from structure 473-R. The extended four columns in structure 475 resulting from etching structure 473 do not appear as columns in the 90 degree rotated view. Plated Cu 420' is directly above surface 425, wherein plated Cu 420' is directly below metal cap 415', wherein metal cap 415' is directly below INT electrode 410', and wherein INT electrode 410' is still directly below HM 405'. Metal cap 415' and plated Cu 420' are the deposited bottom structural elements, which are modified by the second etching, as described in step 310 of FIG. 3.

Structure 477 is a direct view (i.e., a front view) of the resulting structure from coating structure 475 with dielectric (DE) 430. Structure 477 illustrates the structural shift from structure 475 as DE 430 surrounds the four columns in structure 477 at the top, right, and left edges of each column. Each column in structure 473 consists of HM 405', INT electrode 410', metal cap 415', and plated Cu 420'. Only HM 405' is exposed to DE 430 at the top, right, and left edge. Plated Cu 420' is still directly above surface 425, wherein plated Cu 420' is still directly below metal cap 415', wherein metal cap 415' is still directly below INT electrode 410', and wherein INT electrode 410' is directly below HM 405'. DE 430 is the coating dielectric material used, as described in step 315 of FIG. 3.

Structure 477-R is a 90 degree rotated view of the resulting structure from coating structure 477. Structure 477-R readily illustrates the structural shift from structure 475-R as DE 430 is depicted as a layer above HM 405'. Plated Cu 420' is still directly above surface 425, wherein plated Cu 420' is still directly below metal cap 415', wherein metal cap 415' is still directly below INT electrode 410', and wherein INT electrode 410' is still directly below HM 405'. DE 430 is the coating dielectric material used, as described in step 315 of FIG. 3.

Structure 479 is a direct view (i.e., a front view) of the resulting structure from the CMP of structure 477. Structure 479 illustrates the structural shift from structure 477 as DE 430 is modified to DE 430', wherein DE 430' surrounds the four columns in structure 479 at only the right and left edges of each column. Modification via CMP of DE 430 of structure 477 removes DE 430 from the top edges of the four columns to yield DE 430'. Furthermore, each column in structure 479 is truncated in comparison to each column in structure 477 as HM 405' has been completely removed from structure 479. Thus, the modified columns are composed of INT electrode 410', metal cap 415', and plated Cu 420'. The left and right edges of INT electrode 410', metal cap 415', and plated Cu 420' are exposed to DE 430'. Plated Cu 420' is still directly above surface 425, wherein plated Cu 420' is still directly below metal cap 415', and wherein metal cap 415' is still directly below INT electrode 410'. The CMP is the process which yields DE 430' and removes HM 405', as described in step 320 of FIG. 3.

Structure 479-R is a 90 degree rotated view of the resulting structure from the CMP of structure 477-R. Structure 479-R illustrates the structural shift from structure 477 as DE 430' or DE 430 are not depicted and HM 405' is removed via CMP. DE 430' is still contained within the system however it is not viewable in structure 479-R. Plated Cu 420' is still directly above surface 425, wherein plated Cu 420' is still directly below metal cap 415', and wherein metal cap 415' is still directly below INT electrode 410'. The CMP is the process which yields DE 430' and removes HM 405', as described in step 320 of FIG. 3.

Figure 4B:
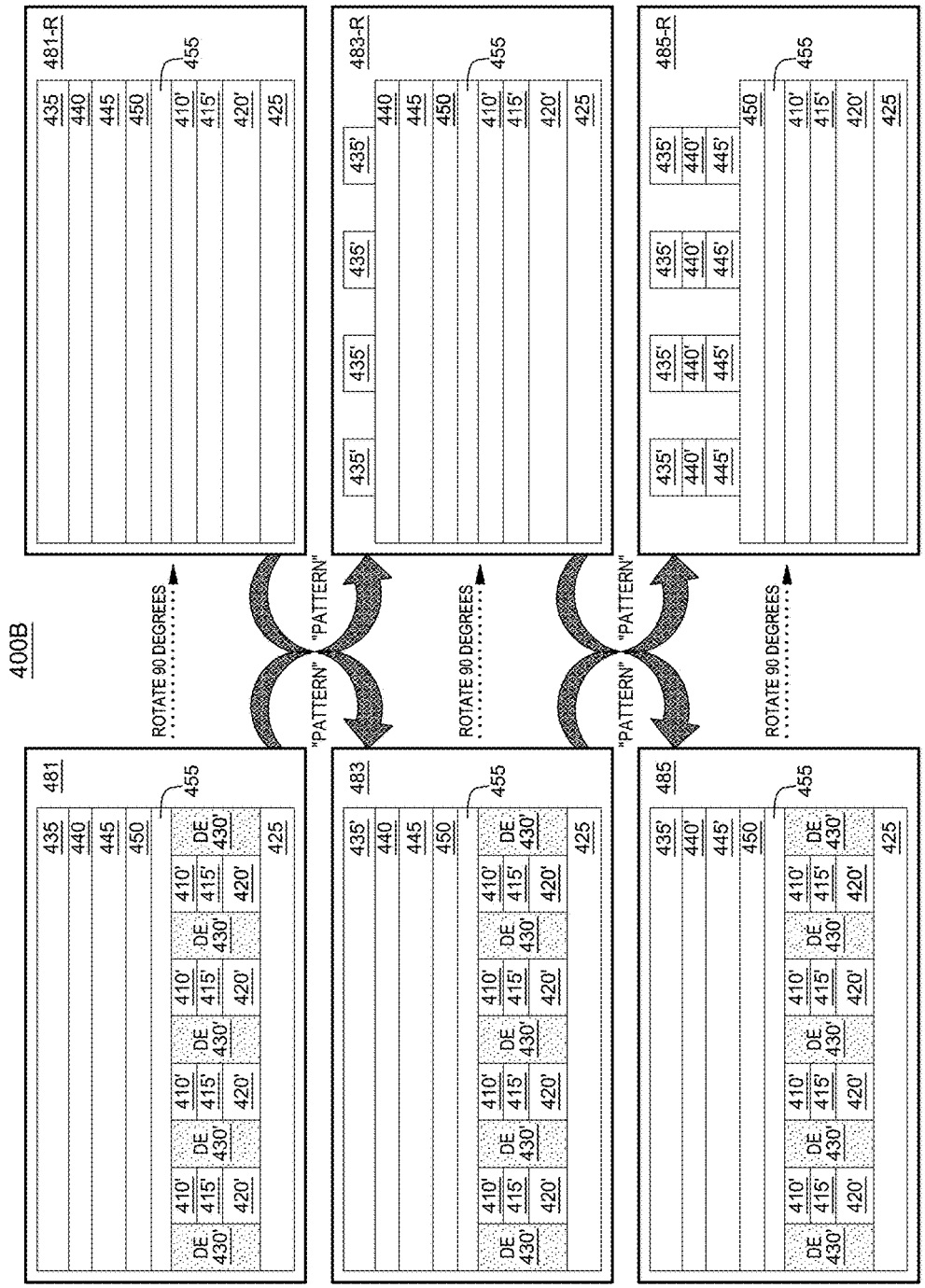
FIG. 4B is a screen shot of intermediate structures depicting the formation of the top electrode layer of a crossbar array of RRAM cells, in accordance with an embodiment of the present invention.

FIG. 4B is a screen shot view of intermediate structures depicting the formation of the top electrode layer of a crossbar array of RRAM cells, in accordance with an embodiment of the present invention.

RRAM intermediate structures 400B depict intermediate structures observed in order to furnish the top electrode layer. Each structure is depicted in two ways—a direct view (i.e., a front view) and a 90 degree rotated view. In some instances, the shift in structure is apparent in the direct view (i.e., a front view) and in other instances, the shift in structure is apparent in the 90 degree rotated view. For clarification purposes, a single apostrophe (') represents a physical modification to a layer of a structural element and a double apostrophe (") represents a further physical modification to an already physically modified layer. Surface 425 is a silicon substrate which can act as a wafer and is amenable to semiconductor fabrication techniques. In this exemplary embodiment, a Cu-based electrode similar or equivalent to electrode 124(T) derives from PVD Cu (e.g., PVD Cu 445). In other embodiments, electrode 124(T) may derive from Ag, Ag-based alloys, Cu-based alloys, plated Cu, or other Cu/Ag species containing large grain boundaries within the solid-state structure.

In an exemplary embodiment, RRAM 455 is a RRAM cell (as described above) and RRAM stack 450 is an electrode similar or equivalent to interface electrode 126(T), which enables the patterning of RRAM 455. HM 435 and HM 435' are hardmasks are not necessarily composed of the same material as HM 405. Metal cap 440 and metal cap 440' are not necessarily composed of similar or exactly the same material as metal cap 415.

Structure 481 is a direct view (i.e., a front view) of the resulting structure where HM 435, metal cap 440, PVD Cu 445, RRAM stack 450, and RRAM 455 are deposited onto structure 479. RRAM 455 is directly above a layer containing columns of INT electrode 410', metal cap 415', and plated Cu 420'; and DE 430'. Surface 425 intersects with DE 430' and plated Cu 420'. RRAM stack 450 is directly above RRAM 455, wherein RRAM stack 450 is directly below PVD Cu 445, wherein PVD Cu 445 is below metal cap 440, and wherein metal cap 440 is below HM 435. HM 435, metal cap 440, PVD Cu 445 are the deposited top structural elements, as described in step 325 of FIG. 3. PVD Cu 445 is an electrode similar or equivalent to electrode 124(T). PVD Cu 445 contains large grain boundaries and is used to construct an electrode similar or equivalent to electrode 124(T). HM 405 and Metal cap 440 are the similar or equivalent structures are HM layer 120 and metal cap 122(T), respectively.

Structure 481-R is a 90 degree rotated view of the resulting structure where HM 435, metal cap 440, PVD Cu 445, RRAM stack 450, and RRAM 455 are deposited onto structure 479. RRAM 455 is depicted directly above INT electrode 410', wherein INT electrode 410' is above metal cap 415', and wherein metal cap 415' is above plated Cu 420'. DE 430 and DE 430' are not viewable in structure 481-R. Surface 425 intersects with plated Cu 420'. RRAM stack 450 is directly above RRAM 455, wherein RRAM stack 450 is directly below PVD Cu 445, wherein PVD Cu 445 is below metal cap 440, and wherein metal cap 440 is below HM 435. HM 435, metal cap 440, PVD Cu 445 are the deposited top structural elements, as described in step 325 of FIG. 3.

Structure 483 is a direct view (i.e., a front view) of the resulting structure from patterning structure 481. HM 435 of structure 481 is the only component of structure 481 which has been modified. Portions of HM 435 are removed via patterning and thus yielding HM 435'. Structure 483 does not illustrate the HM 435' as four columns, as depicted in structure 483-R. RRAM 455 is still directly above a layer containing columns of INT electrode 410', metal cap 415', and plated Cu 420'; and DE 430'. Surface 425 intersects with DE 430' and plated Cu 420'. RRAM stack 450 is still directly above RRAM 455, wherein RRAM stack 450 is still directly below PVD Cu 445, wherein PVD Cu 445 is still below metal cap 440, and wherein metal cap 440 is below HM 435'. HM 435' is the patterned top structural element, as described in step 330 of FIG. 3.

Structure 483-R is a 90 degree rotated view of the resulting structure from patterning structure 481-R. HM 435 of structure 481-R is the only component of structure 481-R which has been modified. Portions of HM 435 are removed via patterning and thus yielding HM 435'. Structure 483-R illustrate HM 435' as four columns, as depicted in structure 483-R. RRAM 455 is depicted directly above INT electrode 410', wherein INT electrode 410' is above metal cap 415', and wherein metal cap 415' is above plated Cu 420'. DE 430 and DE 430' are not viewable in structure 483-R. Surface 425 intersects with plated Cu 420'. RRAM stack 450 is directly above RRAM 455, wherein RRAM stack 450 is directly below PVD Cu 445, wherein PVD Cu 445 is still below metal cap 440, and wherein metal cap 440 is below HM 435'. HM 435' is the patterned top structural element, as described in step 330 of FIG. 3.

Structure 485 is a direct view (i.e., a front view) of the resulting structure from patterning structure 483. Metal Cap 440 and PVD Cu 445 of structure 483 are the only components of structure 483 which have been modified. Portions of metal cap 440 and PVD Cu 445 are removed via patterning and thus yielding metal cap 440' and PVD Cu 445', respectively. Structure 485 does not illustrate the HM 435', metal cap 440' and PVD Cu 445' as four columns, as depicted in structure 485-R. RRAM 455 is still directly above a layer containing columns of INT electrode 410', metal cap 415', and plated Cu 420'; and DE 430'. Surface 425 intersects with DE 430' and plated Cu 420'. RRAM stack 450 is still directly above RRAM 455, wherein RRAM stack 450 is still directly below PVD Cu 445', wherein PVD Cu 445' is below metal cap 440', and wherein metal cap 440' is below HM 435'. PVD Cu 445' and metal cap 440' are the patterned top structural elements, as described in step 330 of FIG. 3.

Structure 485-R is a 90 degree rotated view of the resulting structure from patterning structure 483-R. Metal Cap 440 and PVD Cu 445 of structure 483 are the only components of structure 483 which have been modified. Portions of metal cap 440 and PVD Cu 445 are removed via patterning and thus yielding metal cap 440' and PVD Cu 445', respectively. Structure 485-R illustrate four columns composed of HM 435', metal cap 440', and PVD Cu 445', as depicted in structure 485-R. RRAM 455 is depicted directly above INT electrode 410', wherein INT electrode 410' is above metal cap 415', and wherein metal cap 415' is above plated Cu 420'. DE 430 and DE 430' are not viewable in structure 485-R. Surface 425 intersects with plated Cu 420'. RRAM stack 450 is directly above RRAM 455, wherein RRAM stack 450 is directly below PVD Cu 445', wherein PVD Cu 445' is below metal cap 440', and wherein metal cap 440' is below HM 435'. PVD Cu 445' and metal cap 440' are the patterned top structural elements, as described in step 330 of FIG. 3.

Figure 4C:
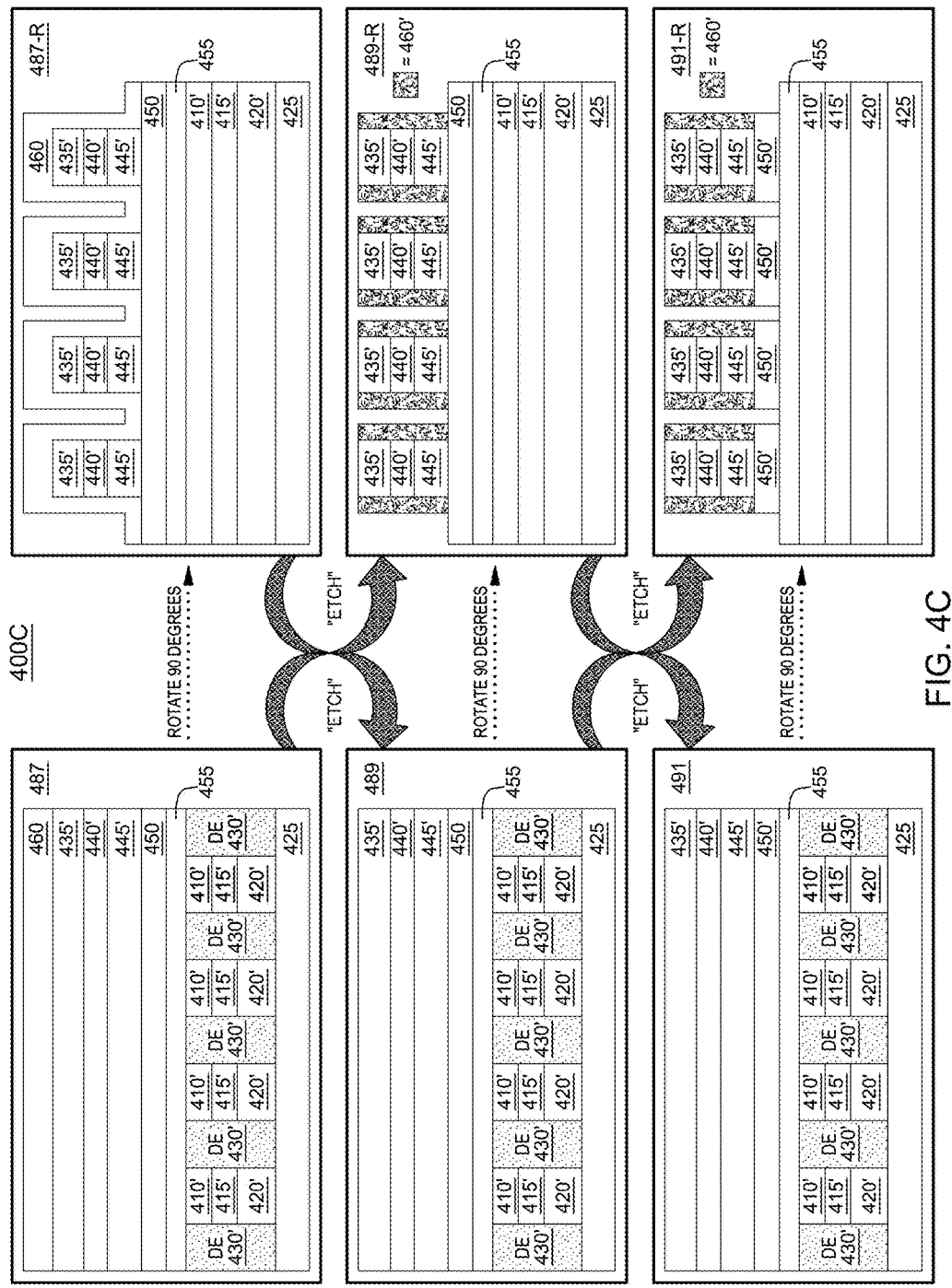
FIG. 4C is a screen shot of intermediate structures depicting the formation of side walls, in accordance with an embodiment of the present invention.

FIG. 4C is a screenshot view of intermediate structures depicting the formation of side walls, in accordance with an embodiment of the present invention.

RRAM intermediate structures 400C depict the intermediate structures observed in order to furnish the side walls deriving from spacers. Each structure is depicted in two ways—a direct view (i.e., a front view) and a 90 degree rotated view. In some instances, the shift in structure is apparent in the direct view (i.e., a front view) and in other instances, the shift in structure is apparent in the 90 degree rotated view. A single apostrophe (') represents a physical modification to a layer of a structural element and a double apostrophe (") represents a further physical modification to an already physically modified layer. Surface 425 is a silicon substrate which can act as a wafer and is amenable to semiconductor fabrication techniques.

HM 435' is a hardmask which is composed of similar or exactly the same material as HM 435 and HM 405. Metal Cap 440' is a metal cap which may not necessarily be composed of similar or exactly the same material as metal cap 415'. Spacer 460 is silicon nitride and serves as a sidewall and protects Cu or Ag from chemical modification during the patterning of RRAM 455. While serving as a sidewall, spacer 460 may be composed of other non-oxide dielectric material aside from silicon nitride, Structure 487 is a direct view (i.e., a front view) of the resulting structure where spacer 460 is deposited onto structure 485. In contrast to structure 487-R, structure 487 illustrates spacer 460 as a layer above HM 435', metal cap 440', and PVD Cu 445'. RRAM 455 is directly above a layer containing: (i) columns of INT electrode 410', metal cap 415', and plated Cu 420'; and (ii) DE 430'. Surface 425 intersects with DE 430' and plated Cu 420'. RRAM stack 450 is directly above RRAM 455, wherein RRAM stack 450 is directly below PVD Cu 445', wherein PVD Cu 445' is below metal cap 440', and wherein metal cap 440' is below HM 435'. The etching of spacer 460 is described in step 335 of FIG. 3.

Structure 487-R is a 90 degree rotated view of the resulting structure from depositing spacer 460 onto structure 485. In contrast to structure 487, structure 487-R illustrates spacer 460 surrounding the top, right, and left edges of the four columns composed of HM 435', metal cap 440', and PVD Cu 445'. Furthermore, portions of spacer 460 are above RRAM stack 450. RRAM 455 is depicted directly above INT electrode 410', wherein INT electrode 410' is above metal cap 415', and wherein metal cap 415' is above plated Cu 420'. DE 430 and DE 430' are not viewable in structure 487-R. Surface 425 intersects with plated Cu 420'. RRAM stack 450 is directly above RRAM 455, wherein RRAM stack 450 is directly below PVD Cu 445', wherein PVD Cu 445' is below metal cap 440', and wherein metal cap 440' is below HM 435'. Spacer 460 is described in step 335 of FIG. 3.

Structure 489 is a direct view (i.e., a front view) of the resulting structure where spacer 460 within structure 487 is etched. Spacer 460 of structure 487-R is the only component of 487-R which has been modified. Portions of spacer 460 are removed via etching to yield spacer 460'. In contrast to structure 489-R, structure 489 does not illustrate spacer 460 or spacer 460' surrounding the right and left edges of the four columns composed of HM 435', metal cap 440', and PVD Cu 445'. RRAM 455 is directly above a layer containing: (i) columns of INT electrode 410', metal cap 415', and plated Cu 420'; and (ii) DE 430'. Surface 425 intersects with DE 430' and plated Cu 420'. RRAM stack 450 is directly above RRAM 455, wherein RRAM stack 450 is directly below PVD Cu 445', wherein PVD Cu 445' is below metal cap 440', and wherein metal cap 440' is below HM 435'. The etching of spacer 460 is described in step 340 of FIG. 3.

Structure 489-R is a 90 degree rotated view of the resulting structure via etching structure 487-R. Spacer 460 of structure 487-R is the only component of 487-R which has been modified. Portions of spacer 460 are removed via etching to yield spacer 460'. In contrast to structure 489, structure 489-R illustrates spacer 460' surrounding the right and left edges of the four columns composed of HM 435', metal cap 440', and PVD Cu 445'. RRAM 455 is depicted directly above INT electrode 410', wherein INT electrode 410' is above metal cap 415', and wherein metal cap 415' is above plated Cu 420'. DE 430 and DE 430' are not viewable in structure 489-R. Surface 425 intersects with plated Cu 420'. RRAM stack 450 is directly above RRAM 455, wherein RRAM stack 450 is directly below PVD Cu 445', wherein PVD Cu 445' is below metal cap 440', and wherein metal cap 440' is below HM 435'. The etching of spacer 460 is described in step 340 of FIG. 3.

Structure 491 is a direct view (i.e., a front view) of the resulting structure, RRAM stack 450 via etching structure 489. RRAM stack 450 of structure 491 is the only component of 489 which has been modified. Portions of RRAM stack 450 are removed via etching to yield RRAM stack 450'. In contrast to structure 491-R, structure 491 does not illustrate spacer 460' units adjacent to the edges of the four columns composed of HM 435', metal cap 440', PVD Cu 445', and RRAM stack 450'. RRAM 455 is directly above a layer containing: (i) columns of INT electrode 410', metal cap 415', and plated Cu 420'; and (ii) DE 430'. Surface 425 intersects with DE 430' and plated Cu 420'. RRAM stack 450' is directly above RRAM 455, wherein RRAM stack 450' is directly below PVD Cu 445', wherein PVD Cu 445' is below metal cap 440', and wherein metal cap 440' is below HM 435'. The etching of RRAM stack 450 is described in step 340 of FIG. 3.

Structure 491-R is a 90 degree rotated view of the resulting structure via etching structure 489-R. RRAM stack 450 of structure 491 is the only component of 491 which has been modified. Portions of RRAM stack 450 are removed via etching to yield RRAM stack 450'. In contrast to structure 491, structure 491-R illustrates spacer 460' as being adjacent and intersecting with only the side walls of the four columns composed of HM 435', metal cap 440', and PVD Cu 445'. The bottom of spacer 460' and the bottom of PVD Cu 445' are adjacent and intersecting with the top portion of RRAM stack 450'. RRAM 455 is depicted directly above INT electrode 410', wherein INT electrode 410' is above metal cap 415', and wherein metal cap 415' is above plated Cu 420'. DE 430 and DE 430' are not viewable in structure 491-R. Surface 425 intersects with plated Cu 420'. RRAM stack 450' is directly above RRAM 455, wherein RRAM stack 450' is directly below PVD Cu 445', wherein PVD Cu 445' is below metal cap 440', and wherein metal cap 440' is below HM 435'. The etching of RRAM stack 450 is described in step 340 of FIG. 3.

Figure 4D:
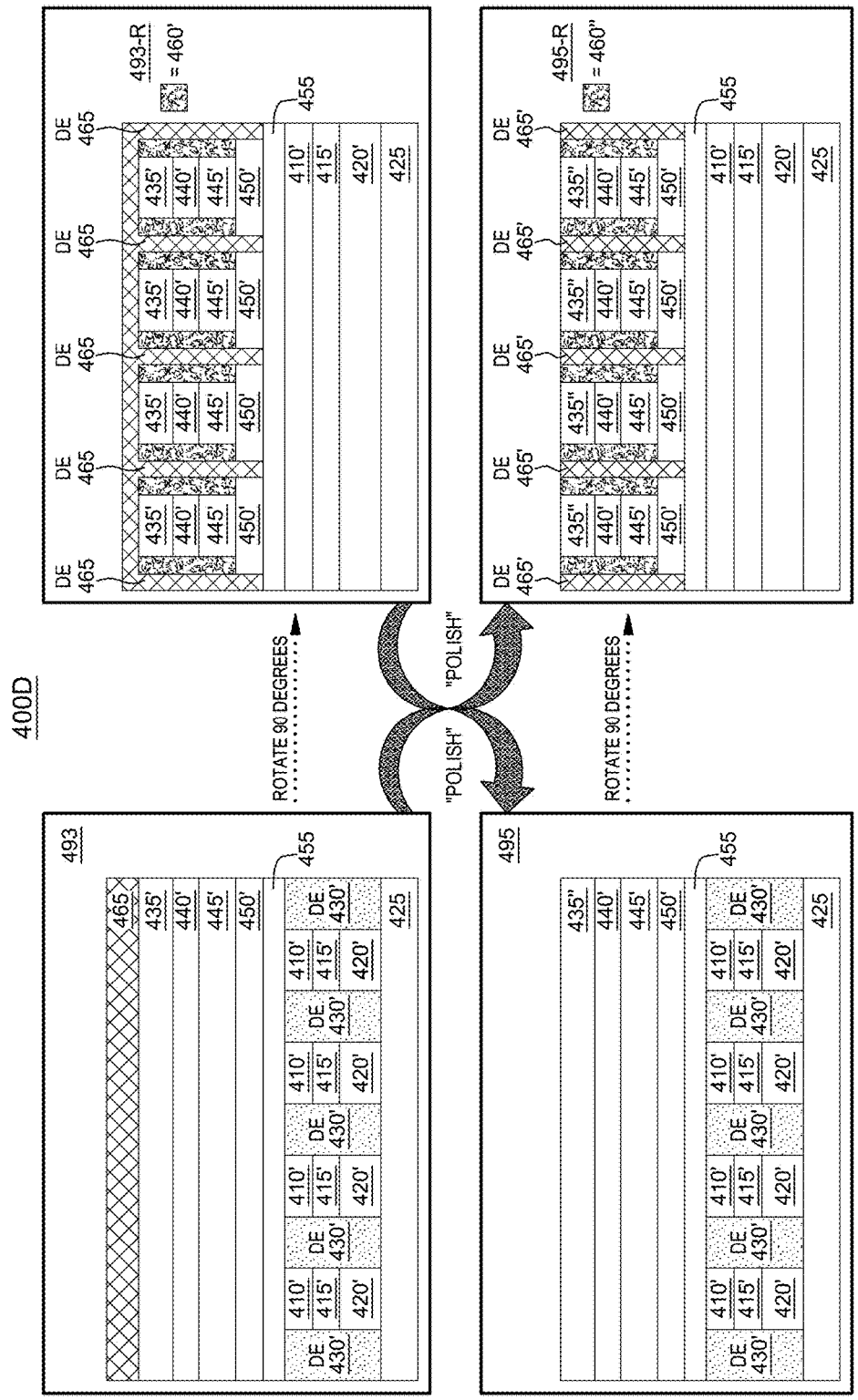
FIG. 4D is a screen shot of intermediate structures depicting the formation of the crossbar array of RRAM cells, in accordance with an embodiment of the present invention.

FIG. 4D is a screenshot view of intermediate structures depicting the formation of the crossbar array of RRAM cells, in accordance with an embodiment of the present invention.

RRAM structures 400D depict the intermediate structures observed in order to furnish the crossbar array of RRAM cells. Each structure is depicted in two ways—a direct view (i.e., a front view) and a 90 degree rotated view. In some instances, the shift in structure is apparent in the direct view (i.e., a front view) and in other instances, the shift in structure is apparent in the 90 degree rotated view. A single apostrophe (') represents a physical modification to a layer of a structural element and a double apostrophe (") represents a further physical modification to an already physically modified layer. Surface 425 is a silicon substrate which can act as a wafer and is amenable to semiconductor fabrication techniques.

In an exemplary embodiment, HM 435' is a hardmask which is composed of similar or exactly the same material as HM 435". Metal Cap 440' is a metal cap which may not necessarily be composed of similar or exactly the same material as metal cap 415'. Spacers 460' and 460" are silicon nitrides and serve as a sidewall and protects Cu or Ag from chemical modification during the patterning of RRAM 455. Dielectric material (DE) 465 is composed of similar or exactly the same material as DE 465', DE 430, and DE 430'

Structure 493 is a direct view (i.e., a front view) of the resulting structure where DE 465 is coated into structure 491. In contrast to structure 487-R, structure 487 does not illustrate spacer DE 465 surrounding the edges of the four columns composed of spacer 460', HM 435', metal cap 440', PVD Cu 445', and RRAM stack 450'. RRAM 455 is directly above a layer containing columns of INT electrode 410', metal cap 415', and plated Cu 420'; and DE 430'. Surface 425 intersects with DE 430' and plated Cu 420'. RRAM stack 450' is directly above RRAM 455, wherein RRAM stack 450' is directly below PVD Cu 445', wherein PVD Cu 445' is below metal cap 440', and wherein metal cap 440' is below HM 435'. The coating of structure 491 with DE 465 is described in step 340 of FIG. 3.

Structure 493-R is a 90 degree rotated view of the resulting structure where DE 465 is coated into structure 491-R. In contrast to structure 493, structure 493-R illustrates DE 465 as adjacent and intersecting with spacer 460' and RRAM stack 450'. Furthermore, structure 493-R illustrates spacer 460' as being adjacent and intersecting with only the side walls of the four columns composed of HM 435', metal cap 440', and PVD Cu 445'. The bottom of spacer 460' and the bottom of PVD Cu 445' are adjacent and intersecting with the top portion of RRAM stack 450'. RRAM 455 is depicted directly above INT electrode 410', wherein INT electrode 410' is above metal cap 415', and wherein metal cap 415' is above plated Cu 420'. DE 430 and DE 430' are not viewable in structure 493-R. Surface 425 intersects with plated Cu 420'. RRAM stack 450' is directly above RRAM 455, wherein RRAM stack 450' is directly below PVD Cu 445', wherein PVD Cu 445' is below metal cap 440', and wherein metal cap 440' is below HM 435'. RRAM 455 is depicted directly above INT electrode 410', wherein INT electrode 410' is above metal cap 415', and wherein metal cap 415' is above plated Cu 420'. DE 430 and DE 430' are not viewable in structure 487-R. Surface 425 intersects with plated Cu 420'. RRAM stack 450' is directly above RRAM 455, wherein RRAM stack 450' is directly below PVD Cu 445', wherein PVD Cu 445' is below metal cap 440', and wherein metal cap 440' is below HM 435'. The coating of structure 491-R with DE 465 is described in step 340 of FIG. 3.

Structure 495 is a direct view (i.e., a front view) of the resulting structure where DE 465, HM 435', and spacer 460' of structure 493 are polished. DE 465, HM 435', and spacer 460' of structure 493 are the only component of structure 493 which have been modified. Portions of DE 465, HM 435', and spacer 460' are removed via polishing to yield DE 465', HM 435", and spacer 460", respectively. DE 465', HM 435", and spacer 460" are level with each other to impart planarity to structure 495. In contrast to structure 495, structure 495 does not illustrate spacer DE 465' surrounding the edges of the four columns composed of spacer 460", HM 435", metal cap 440', PVD Cu 445', and RRAM stack 450'. RRAM 455 is directly above a layer containing columns of INT electrode 410', metal cap 415', and plated Cu 420'; and DE 430'. Surface 425 intersects with DE 430' and plated Cu 420'. RRAM stack 450' is directly above RRAM 455, wherein RRAM stack 450' is directly below PVD Cu 445', wherein PVD Cu 445' is below metal cap 440', and wherein metal cap 440' is below HM 435'. The polishing of structure 493 is described in step 345 of FIG. 3.

Structure 495-R is a 90 degree rotated view of the resulting structure where DE 465, HM 435', and spacer 460' of structure 493-R are modified. DE 465, HM 435', and spacer 460' of structure 493-R are the only component of structure 493 which have been modified. Portions of DE 465, HM 435', and spacer 460' are removed via polishing to yield DE 465', HM 435", and spacer 460". DE 465', HM 435", and spacer 460" are level with each other to impart planarity to structure 495. In contrast to structure 495, structure 495-R illustrates DE 465' as adjacent and intersecting with spacer 460" and RRAM stack 450'. Furthermore, structure 495-R illustrates spacer 460" as being adjacent and intersecting with only the side walls of the four columns composed of HM 435", metal cap 440', and PVD Cu 445'. The bottom of spacer 460" and the bottom of PVD Cu 445' are adjacent and intersecting with the top portion of RRAM stack 450'. RRAM 455 is depicted directly above INT electrode 410', wherein INT electrode 410' is above metal cap 415', and wherein metal cap 415' is above plated Cu 420'. DE 430 and DE 430' are not viewable in structure 491-R. Surface 425 intersects with plated Cu 420'. RRAM stack 450 is directly above RRAM 455, wherein RRAM stack 450' is directly below PVD Cu 445', wherein PVD Cu 445' is below metal cap 440', and wherein metal cap 440' is below HM 435'. RRAM stack 4 surrounding the top, right, and left edges of the four columns composed of HM 435', metal cap 440', and PVD Cu 445'. RRAM 455 is depicted directly above INT electrode 410', wherein INT electrode 410' is above metal cap 415', and wherein metal cap 415' is above plated Cu 420'. DE 430 and DE 430' are not viewable in structure 495-R. Surface 425 intersects with plated Cu 420'. RRAM stack 450 is directly above RRAM 455, wherein RRAM stack 450' is directly below PVD Cu 445', wherein PVD Cu 445' is below metal cap 440', and wherein metal cap 440' is below HM 435'. The polishing of structure 493-R is described in step 345 of FIG. 3.

What is claimed is:

1. A crossbar array device comprising:
   an array of resistive random access memory (RRAM) having respective top portions and respective bottom portions;
   a first electrode layer operatively connected to a respective bottom portion of the array of RRAM; and
   a second electrode layer operatively connected to a respective top portion of the array of RRAM,
   wherein the first electrode layer and the second electrode layer each contain a transition metal containing crystal grains on a sub-micron scale and each RRAM contains a critical dimension that is inversely proportional to a diameter of each crystal grain in the first electrode layer.

2. The crossbar array device of claim 1, wherein the crystal grains contain patterned lines with grains larger than a critical dimension line.

3. The crossbar array device of claim 1, wherein the first electrode layer comprises:
   a first metal film deposited over a silicon surface;

a first metal cap deposited over the first metal film; and a first electrode deposited over the first metal cap.

4. The crossbar array device of claim 3, wherein the first electrode, comprises:

a top portion and a bottom portion, wherein the respective top portion of the first electrode is operatively connected to respective bottom portions of the array of RRAM.

5. The crossbar array device of claim 3, wherein the first metal film is selected from a group consisting of copper and silver.

6. The crossbar array device of claim 1, wherein the second electrode layer comprises:

a second metal film deposited over a second electrode;

a second metal cap deposited over the second metal film; and a hardmask layer deposited over the second metal cap.

7. The crossbar array device of claim 6, wherein the second electrode, comprises:

a top portion and a bottom portion, wherein the respective bottom portion of the second electrode is operatively connected to respective top portions of the array of RRAM.

8. The crossbar array device of claim 7, wherein the second metal film is selected from a group consisting of copper and silver.

9. The crossbar array device of claim 6, wherein a spacer is disposed around the second electrode layer and interfaces with a first dielectric material and a hardmask.

10. The crossbar array device of claim 1, further comprising:

a second dielectric material operatively connected to the bottom portions of the array of RRAM and the first electrode layer.

11. The crossbar array device of claim 1, wherein the transition metal in the first electrode layer is equivalent to the transition metal in the second electrode layer.

12. The crossbar array device of claim 1, wherein the transition metal in the first electrode layer is not equivalent to the transition metal in the second electrode layer.

13. The crossbar array device of claim 1, wherein the sub-micron scale comprises crystal grains of approximately $10^{-6}$ m.

* * * * *